(12) United States Patent  
Chowdhury et al.

(10) Patent No.: US 7,078,334 B1  
(45) Date of Patent: Jul. 18, 2006

(54) IN SITU HARD MASK APPROACH FOR SELF-ALIGNED CONTACT ETCH

(75) Inventors: Saurabh Dutta Chowdhury, Belmont, CA (US); Mehran Sedigh, Campbell, CA (US); Chan Lon Yang, Los Gatos, CA (US); Prabhu Goplana, Fremont, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 527 days.

(21) Appl. No.: 10/163,970

(22) Filed: Jun. 6, 2002

(51) Int. Cl.  
*H01L 21/302* (2006.01)

(52) U.S. Cl. ............. 438/637; 438/700; 438/714; 438/717; 438/723; 438/743; 216/41; 216/47; 216/49; 216/67; 216/80

(58) Field of Classification Search ............ 216/41, 216/47, 49, 67, 80; 438/637, 700, 714, 717, 438/723, 743  
See application file for complete search history.

(56) References Cited

U.S. PATENT DOCUMENTS

| 5,770,097 | A | * | 6/1998 | O'Neill et al. | 216/60 |
| 6,198,601 | B1 | * | 3/2001 | Hira et al. | 360/235.9 |
| 6,214,743 | B1 | | 4/2001 | Oiao et al. | |
| 6,319,821 | B1 | * | 11/2001 | Liu et al. | 438/636 |
| 6,337,244 | B1 | * | 1/2002 | Prall et al. | 438/257 |
| 6,355,572 | B1 | * | 3/2002 | Ikegami | 438/706 |
| 6,506,497 | B1 | * | 1/2003 | Kennedy et al. | 428/447 |
| 6,635,185 | B1 | * | 10/2003 | Demmin et al. | 216/64 |
| 6,635,566 | B1 | * | 10/2003 | Blosse et al. | 438/638 |
| 6,677,242 | B1 | * | 1/2004 | Liu et al. | 438/706 |
| 6,734,108 | B1 | * | 5/2004 | Jin et al. | 438/700 |

* cited by examiner

*Primary Examiner*—Anita Alanko  
(74) *Attorney, Agent, or Firm*—Bradley T. Sako

(57) ABSTRACT

According to one embodiment, a method (100) may include forming a first insulating layer over a semiconductor substrate (step 102), forming a hard mask layer (step 104), and forming a photoresist etch mask having a thickness of less than about 4,000 angstroms (step 106). Such a reduced thickness may conventionally lead to uncontrolled etching and/or may require multiple steps to ensure feature formation. A method (100) may further include etching an opening through at least one half the thickness of the hard mask layer to form a hard mask (step 108) and etching through a first insulating layer without first removing a photoresist layer (step 110). Such etching can essentially consume a photoresist layer, however controllability can be maintained as etching may continue with a hard mask in place.

9 Claims, 6 Drawing Sheets

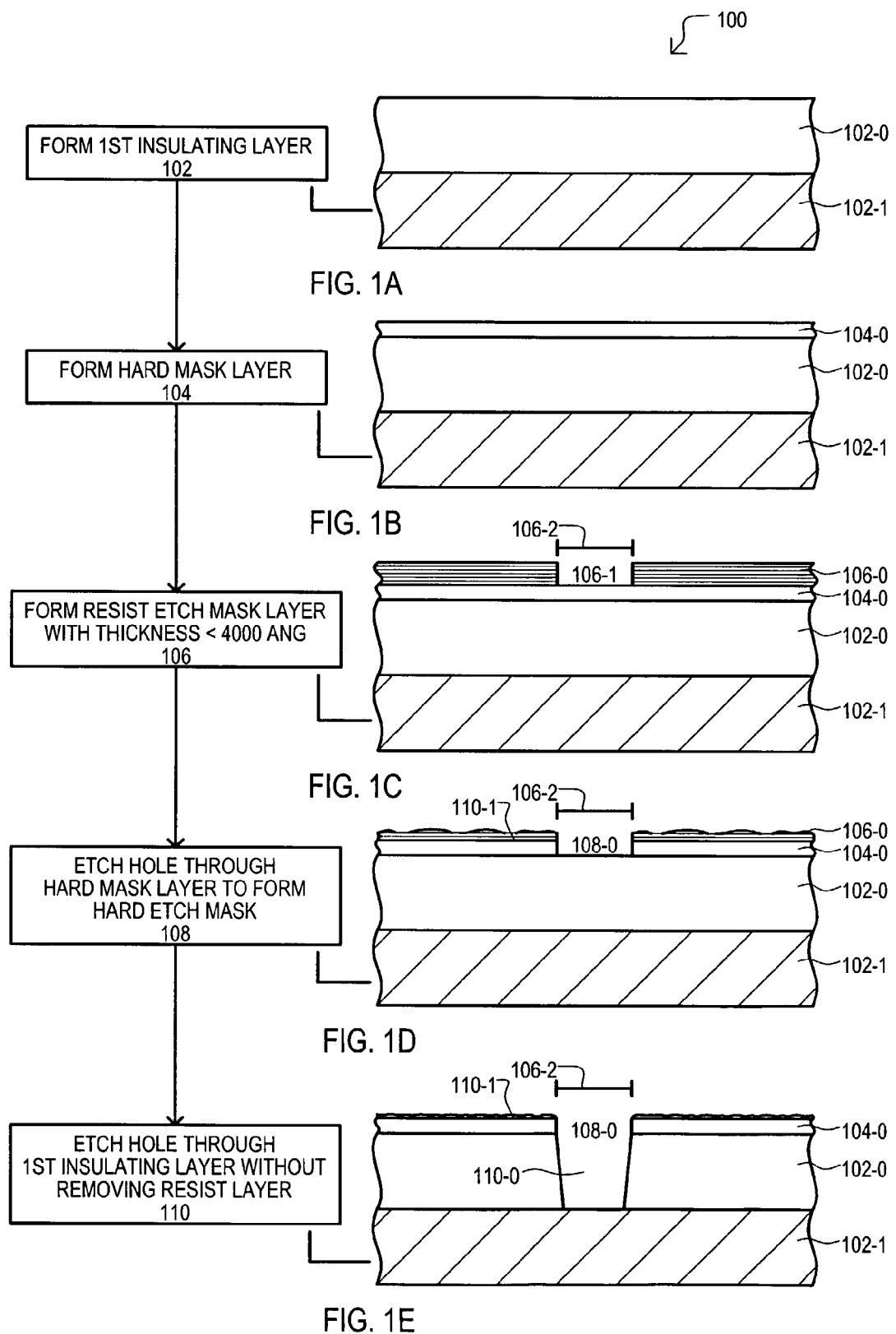

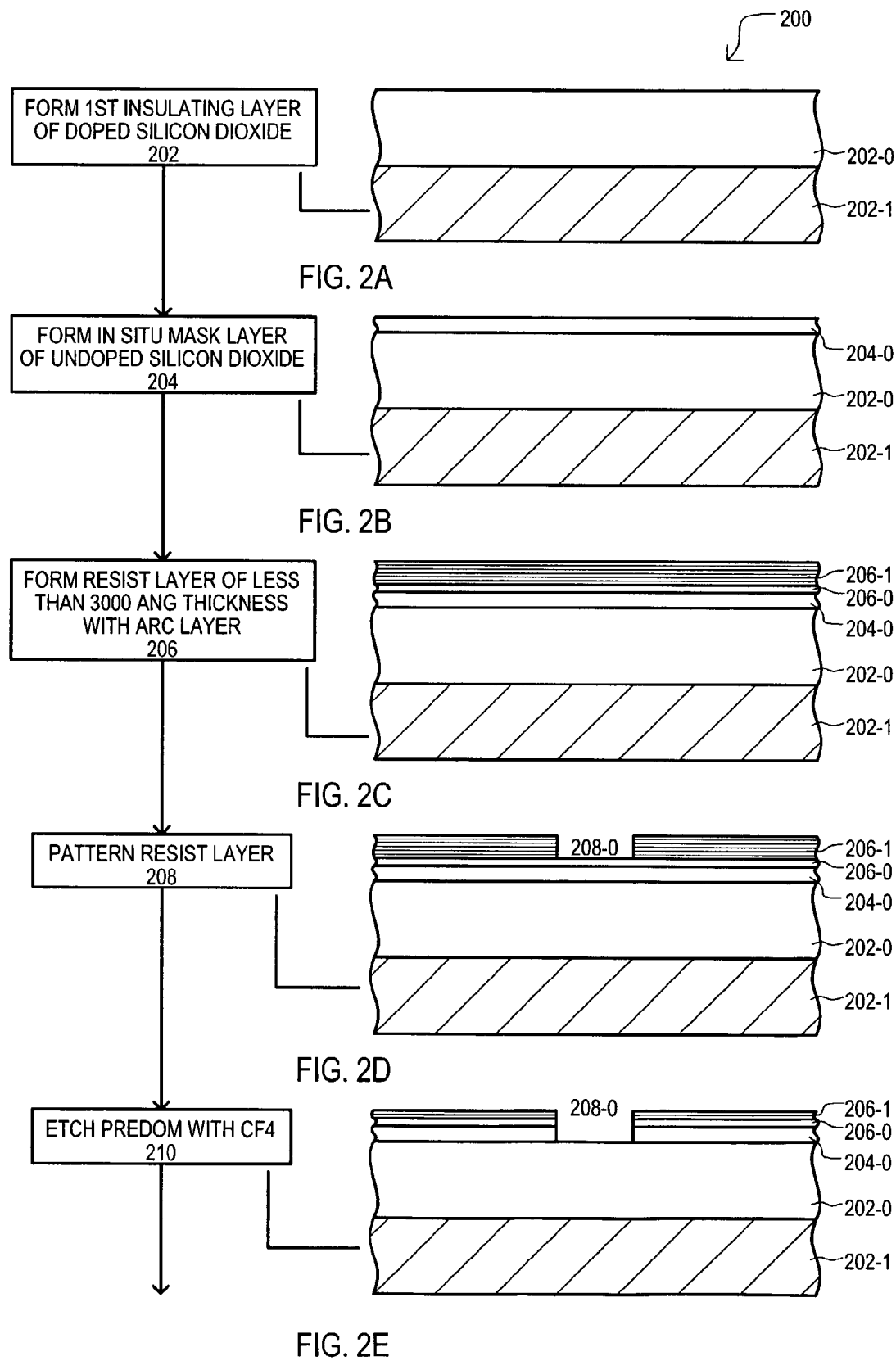

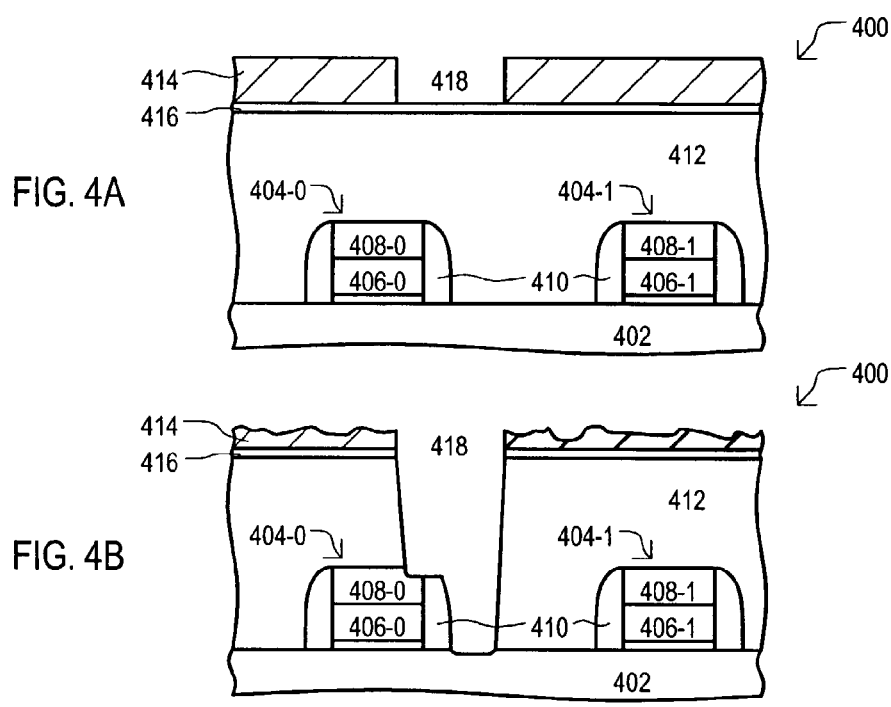
FIG. 4A
FIG. 4B
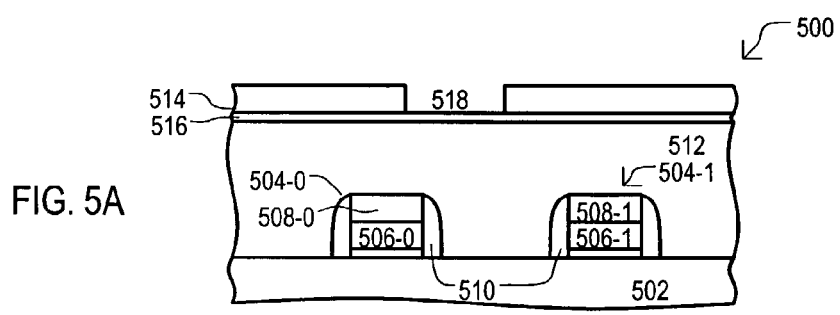
FIG. 5A
FIG. 5B
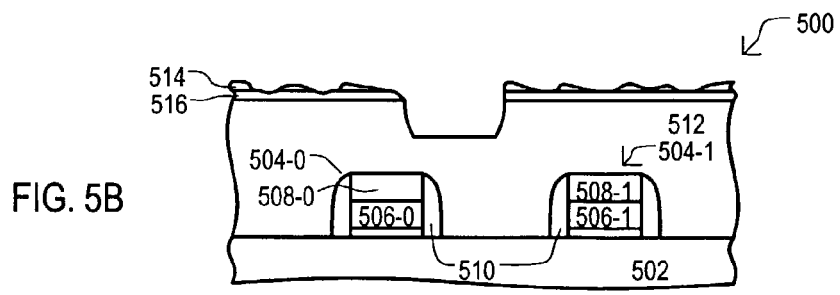
FIG. 5C

IN SITU HARD MASK APPROACH FOR SELF-ALIGNED CONTACT ETCH

TECHNICAL FIELD

The present invention relates generally to the formation of contact holes, and more particularly to self-aligned contact methods.

BACKGROUND OF THE INVENTION

In a semiconductor device, different conductive or semiconductive layers can be connected to one another by contacts and/or vias. Contacts and/or vias can include contact holes that extend through one or more insulating layers. Conventionally, contacts can connect a substrate to a conductive or semiconductive layer, while a via can connect two different conductive or semiconductive layers to one another.

One concern with certain contact structures can be the alignment of a contact with a lower conducting layer. Because a contact is usually formed by etching a hole through an insulating layer to an underlying conductive or semiconductive layer, it is desirable for the etched hole to be situated directly over the desired contact location in the lower conducting layer. Further, it may be desirable to ensure that a contact hole can be sufficiently insulated from other conductive lines. For example, in the case of semiconductor devices having insulated gate field effect transistors (IGFETs), such as metal-oxide-semiconductor FETs (MOSFETs), it is desirable to have a contact hole aligned with a source or drain, but at the same time, be sufficiently insulated from a gate conductor.

To better understand the formation of certain integrated circuit structures, including contacts and contact holes, a conventional self-aligned contact (SAC) approach is set forth in FIGS. 4A and 4B. FIG. 4A shows a semiconductor device 400 that includes a semiconductor substrate 402. Conductive structures 404-0 and 404-1 may be formed on a substrate 402 having surrounding insulating structures that may allow for self-aligned contacts. In the particular example of FIGS. 4A and 4B, conductive structures 404-0 and 404-1 may be typical insulated gate field effect transistor (IGFET) devices that include a conductive gate (406-0 and 406-1), a top insulator (408-0 and 408-1), as well as insulating sidewalls (410).

An insulator layer 412 may be formed over conductive structures 404-0 and 404-1. In one particular example, an insulator layer 412 may comprise a layer of doped silicon dioxide, such as borophosphosilicate glass (BPSG) or phosphosilicate glass (PSG), for example.

FIG. 4A shows a semiconductor device 400 following a lithography step that develops a pattern of photoresist. More particularly, FIG. 4A shows an example of a lithography step for a process aimed at wavelengths of 248 nm or larger, and includes developing a layer photoresist 414 having a thickness of about 6500 angstroms (Å). A bottom anti-reflective coating (BARC) 416, formed from a light absorbing polymer or the like, can be formed below photoresist layer 414. Development of a photoresist layer 414 may result in mask opening 418.

Conventionally, a contact hole may then be etched through a BARC layer 416 and insulator layer 412. A conventional semiconductor device following a contact hole etch is shown in FIG. 4B. As shown in FIG. 4B, following a conventional etching step, while some of the photoresist layer 414 may have been removed, sufficient photoresist exists to continue to mask insulator layer 412, and thus form a contact hole having an acceptable size. Whether a contact hole may be of an acceptable size can be determined by measuring the contact hole.

It is noted that a conventional approach, such as that shown in FIGS. 4A and 4B may be a single etch step. That is, once an etch mask is formed a single etching operation may form a contact hole.

While a conventional approach, such as that shown in FIGS. 4A and 4B, may be appropriate for photoresist layers having a thickness greater than about 3000 Å, at a smaller resist thickness such approaches may have drawbacks.

A drawback to conventional approaches at a smaller resist thickness is shown in FIGS. 5A to 5C. FIG. 5A shows a semiconductor device 500 that includes some of the same general features as FIGS. 4A and 4B, including a semiconductor substrate 502, conductive structures (504-0 and 504-1) with conductive gates (506-0 and 506-1), a top insulator (508-0 and 508-1), insulating sidewalls 510, insulator layer 512, a layer photoresist 514, a bottom anti-reflective coating (BARC) 516, and a mask opening 518.

The conventional example of FIGS. 5A to 5C differs from that of FIGS. 4A and 4B in that a higher resolution photolithography method is used. Such a higher resolution approach, due to more limited fields of focus, can include a photoresist layer 514 having a thickness of about 3500 Å or less. Unfortunately, a reduction in thickness may not be compatible with some conventional etching approaches. This is illustrated in FIGS. 5B and 5C.

In FIG. 5B, a semiconductor device 500 is shown, part way through a conventional single step etching process. It is shown that while the etching of a contact hole has not been completed, a photoresist layer 514, due to its smaller thickness, has been substantially removed. Without a photoresist layer 514 intact, etching may proceed unconstrained. Consequently, as shown in FIG. 5C, a resulting contact hole may be greater than a desired size, shown by dashed lines.

U.S. Pat. No. 6,214,743, issued to Qiao et al on Apr. 10, 2001, entitled METHOD AND STRUCTURE FOR MAKING SELF-ALIGNED CONTACTS, shows a method of forming a self-aligned contact that includes a two step etch process with a "hard" etch mask. One particular example of such a two step approach is shown in FIGS. 6A to 6C. FIG. 6A shows a semiconductor device 600 that includes some of the same general features as FIGS. 4A and 4B, including a semiconductor substrate 602, conductive structures (604-0 and 604-1) with conductive gates (606-0 and 606-1), a top insulator (608-0 and 608-1), insulating sidewalls 610, insulator layer 612, a layer of photoresist 614, a bottom anti-reflective coating (BARC) 616, and a mask opening 618. Unlike the conventional case as described in FIGS. 4A to 4C, the semiconductor device 600 of FIGS. 6A to 6C may include a hard mask layer 622.

As shown in FIG. 6A, a photoresist layer 614 may be patterned. Then, as shown in FIG. 6B, a hard mask layer 622 may be patterned with a layer of photoresist 614 as a mask. FIG. 6C shows how at a thinner resist thickness (less than 4000 Å), etching through a BARC layer 616 and a hard mask layer 622, may consume all or most of a photoresist layer 614.

Following an initial patterning of a hard mask layer 622, a semiconductor device 600 may be cleaned. Such a cleaning step may include removing a photoresist layer, by an ashing step, or the like. This may or may not be followed by a wet etch. A method may continue by etching with a patterned hard mask layer 622 as an etch mask. A resulting contact hole 620 is shown in FIG. 6C.

Thus, in the example of FIGS. 6A to 6C, a contact formation method may include particular steps. A first step may pattern a hard mask layer 622. A second step may include cleaning to remove a photoresist layer and expose a hard mask. A third step may include etching with a hard mask layer 622.

Alternative conventional approaches to etching contact holes have been proposed. Such approaches attempt to increase selectivity between a photoresist layer and an underlying insulator layer. As a first example, a plasma etching process may employ hexafluorobutadiene ($C_2F_6$) and oxygen ($O_2$) as reactant gases. As a second example, a plasma etching process may employ octafluorocyclobutane ($C_4F_8$), carbon monoxide (CO) and argon as reactant gases. Such approaches may involve greater costs as the gases $C_2F_6$ and $C_4F_8$ may be more expensive than other known etch gases, such as carbon tetrafluoride ($CF_4$) and/or tetrafluoroethane ($C_2H_2F_4$). Still further, such conventional approaches may require particular chamber sensors that can also increase costs.

In light of the above discussion, it would be desirable to arrive at some way of etching contact holes with a smaller resist thickness that does not require as many process steps as conventional approaches. It would also be desirable to arrive at a contact hole etching method that may be less expensive to implement than conventional etches that include gases $C_2F_6$ and $C_4F_8$ and etch gases.

SUMMARY OF THE INVENTION

According to disclosed embodiments, a method may include forming a first insulating layer over a substrate and forming a hard etch mask layer over the first insulating layer. A patterned photoresist layer may be formed over the hard etch mask layer. A method may further include etching through the hard etch mask layer to form a hard etch mask having essentially the same pattern as a photoresist layer. A first insulating layer may then be etched with a photoresist layer and hard etch mask as an etch mask, without a step for removing the photoresist layer.

According to one aspect of the embodiments, a photoresist layer may be consumed as a hard etch mask layer and first insulating layer are etched.

According to another aspect of the embodiments, a photoresist layer may be consumed after about one half the thickness of a hard mask is etched.

According to another aspect of the embodiments, a photoresist layer may have a thickness less than 4,000 angstroms, or less than 3,500 angstroms.

According to another aspect of the embodiments, a hard etch mask layer and first insulating layer may include silicon dioxide, with a first insulating layer having a higher dopant concentration than a hard etch mask layer. For example, a hard etch mask layer may include undoped silicon dioxide and a first insulating layer may have a phosphorous doping greater than 7% by weight.

According to another aspect of the invention, etching through a hard mask layer may include reactive ion etching with predominantly carbon tetrafluoride ($CF_4$) as a reactant gas. Etching through a first insulating layer may include reactive ion etching essentially without $CF_4$ as a reactant gas.

According to another aspect of the embodiments, etching through a hard mask layer may include etching with tetrafluoroethane ($C_2H_2F_4$) as a reactant gas. A flow rate for $C_2H_2F_4$ may be increased to etch through a first insulating layer.

BRIEF DESCRIPTION OF THE DRAWINGS

FIGS. 1A to 1E is a flow diagram and side cross sectional views of a semiconductor device according to a first embodiment.

FIGS. 2A to 2F is a flow diagram and side cross sectional views of a semiconductor device according to a second embodiment.

FIGS. 4A and 4B show a first example of a conventional method of forming contacts in a semiconductor device.

FIGS. 5A to 5C show a second example of a conventional method of forming contacts in a semiconductor device.

DETAILED DESCRIPTION OF THE EMBODIMENTS

Figure 2F:
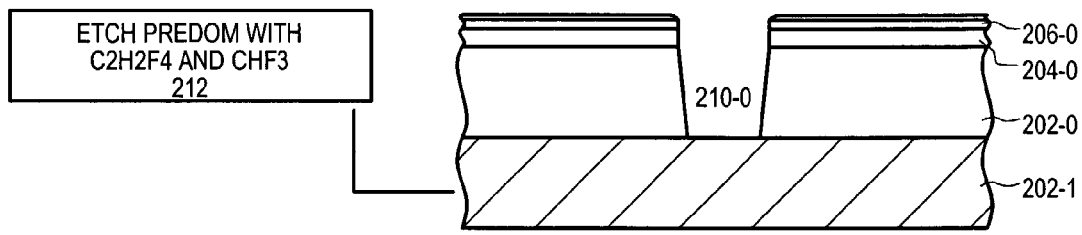

Various embodiments will now be described in conjunction with a number of charts and diagrams. The embodiments set forth approaches to forming contact holes, more particularly, self-aligned contact holes with an in situ hard etch mask. An in situ hard etch mask may be in place below a layer of photoresist and act as an etch mask even as an overlying photoresist layer is consumed. In this way, a contact hole may be formed with a relatively thin photoresist thickness (less than 4,000 angstroms), without necessarily having a hard mask cleaning step.

A method according to a first embodiment will now be described with reference to FIGS. 1A to 1E. FIGS. 1A to 1E show a flow diagram of various steps according to one embodiment, along with corresponding side cross sectional views. A method is designated by the general reference character 100 and may include forming a first insulating layer over a semiconductor substrate (step 102). FIG. 1A shows a first insulating layer 102-0 formed over a substrate 102-1. A first insulating layer 102-0 may comprise a doped silicon dioxide layer, more preferably phosphosilicate glass (PSG), even more preferably high density plasma deposited PSG.

A method 100 may further include forming a hard mask layer (step 104). FIG. 1B shows a semiconductor device following the formation of a hard mask layer 104-0. A hard mask layer 104-0 may be formed over a first insulating layer 102-0, and can include silicon dioxide, more preferably undoped silicon dioxide, alternately referred to as undoped silicate glass (USG).

A photoresist etch mask may then be formed having a thickness of less than about 4,000 angstroms (step 106). Such a reduced thickness may correspond to finer resolution in features. However, as noted above, such a reduced thickness may conventionally lead to uncontrolled etching and/or require multiple steps to ensure a contact hole is adequately formed. FIG. 1C shows a photoresist etch mask 106-0 formed over a hard mask layer 104-0. A photoresist etch mask 106-0 may include at least one photoresist mask opening 106-1.

It is noted that photoresist mask opening 106-1 may have a lateral dimension 106-2. A lateral dimension may be less than 0.2 μm, as such minimum feature size may be possible only with a relatively thin photoresist thickness, such as less than 4,000 Å. However, the present invention may be particularly suited for lateral dimensions that are greater than a minimum dimension, as such relatively larger contact holes may be more susceptible to over etch in conventional etch methods.

A method may further include etching an opening through a hard mask layer to form a hard mask (step 108). Such a step may include etching selective to a photoresist etch mask 106-0.

It is noted that a step 108 may preferably include etching through at least one half the thickness of a hard mask layer 104-0 before a photoresist etch mask 106-0 is consumed by an etch process. In this way, a photoresist etch mask 106-0 may serve to transfer a pattern to a hard mask layer 104-0.

A semiconductor device following a step 108 is shown in FIG. 1D. A hard mask opening 108-0 may be formed in hard mask layer 104-0. Such an opening may be defined by a photoresist mask opening 106-1. A hard mask opening 108-0 may have a lateral dimension that follows that of lateral dimension 106-2.

It is again noted that while FIG. 1D shows a hard mask opening 108-0 as extending through an entire thickness of a hard mask layer 104-0, such an opening 108-0 preferably extends through at least one half the thickness of a hard mask layer 104-0.

As shown in FIG. 1E, a method may further include etching through a first insulating layer without first removing a photoresist layer (step 110). Such a step may include etching selective to a hard mask layer. It is noted that such an approach may differ from conventional hard mask approaches in that a step dedicated to removing a photoresist layer, such as etching with oxygen gas (ashing) can be completely omitted. This can simplify processing and/or increase throughput.

A semiconductor device following a step 110 is shown in FIG. 1E. A hole 110-0 may be formed through a first insulating layer 102-0. A step 110 may result in essentially all of a photoresist layer being removed, while a hard mask layer 104-0 may remain essentially intact. In particular approaches, an etching of a photoresist layer (and an accompanying anti-reflective coating (ARC)) can result in a polymer residue 110-1 being redistributed on a surface of a semiconductor device.

In this way, a hole may be formed in a first insulating layer 102-1 with a photoresist layer 106-0 having a thickness less than about 3500 Å. However, unlike conventional approaches, a step dedicated to removing a photoresist layer 106-0 prior to etching a first insulating layer 102-1 can be omitted.

While the present invention may be viewed with respect to a particular resist thickness and resulting contact hole feature and/or size, the invention may also be conceptualized in terms of particular etch chemistry. Such an embodiment will be described below.

A method according to a second embodiment will now be described with reference to FIGS. 2A to 2F. FIGS. 2A to 2F show a flow diagram of various steps according to a second embodiment, along with corresponding side cross sectional views. The method is designated by the general reference character 200 and may include forming a first insulating layer of doped silicon dioxide (step 202). FIG. 2A shows a first insulating layer 202-0 formed over a substrate 202-1. A first insulating layer 202-0 may include at least one layer of doped silicon dioxide. Such a layer may comprise borophosphosilicate glass (BPSG), more preferably phosphosilicate glass (PSG), even more preferably high density plasma (HDP) deposited PSG having a phosphorous concentration that is greater than 5% by weight, more preferably greater than 7% by weight.

A method 200 may further include forming an in situ mask layer of undoped silicon dioxide (step 204). FIG. 2B shows a semiconductor device following the formation of an in situ mask layer. An in situ mask layer 204-0 may include at least one layer of undoped silicon dioxide (USG).

As shown in FIG. 2C, a method 200 may include forming a photoresist layer that includes an anti-reflective coating (ARC) (step 206). In the particular example of FIG. 2C, ARC layer 206-0 may be a bottom antireflective coating (BARC) formed over an in situ mask layer 204-0. A photoresist layer 206-1 may be formed over an ARC 206-0 layer.

A method 200 may further include patterning a photoresist layer (step 208). As shown in FIG. 2D, a resist patterning process may form a mask opening 208-0. A mask opening 208-0 may expose a portion of an antireflective coating 206-0.

A method 200 may continue with a number of etch steps. One etch step may include etching with predominantly carbon tetrafluoride ($CF_4$) as a reactant gas (step 210). As shown in FIG. 2E, such a step may remove portions of an ARC layer 206-1 formed below a mask opening. In addition, such a step may remove at least one half the thickness of an in situ mask layer 204-0 below a mask opening 208-0. Still further, such a step may remove essentially all of a photoresist layer 206-1, and redistribute such a layer over an in situ mask layer 204-0 as a polymer.

In one particular approach, etching predominantly with $CF_4$ (step 210) can include etching while $CF_4$ makes up greater than about 70% of flow rate of all reactant gases entering a chamber, more particularly greater than about 75%, even more particularly about 80%.

Another etch step may include etching with predominantly trifluoromethane ($CHF_3$) and tetrafluoroethane ($C_2H_2F_4$) (step 212). As shown in FIG. 2F, such a step may remove any remaining portions of an in situ mask layer 204-0 and essentially all portions of a first insulating layer 202-0 formed below a mask opening 208-0.

In one particular approach, etching predominantly with $CHF_3$ and $C_2H_2F_4$ (step 212) can include etching while $CHF_3$ and $C_2H_2F_4$ make up greater than about 80% of flow rate of all reactant gases entering a chamber, more particularly greater than about 90%, even more particularly about 100%.

In this way, a hole may be opened through an in situ mask layer 204-0 and a first insulating layer 202-0 to a substrate 202-1 with a particular plasma chemistry that can consume a photoresist mask while working in conjunction with an in situ hard mask.

While the present invention may be viewed with respect to a particular resist thickness and/or an etching chemistry, the invention may also be conceptualized as a self-aligned contact (SAC) etch method. Such an embodiment will now be described in detail.

Figure 3A:
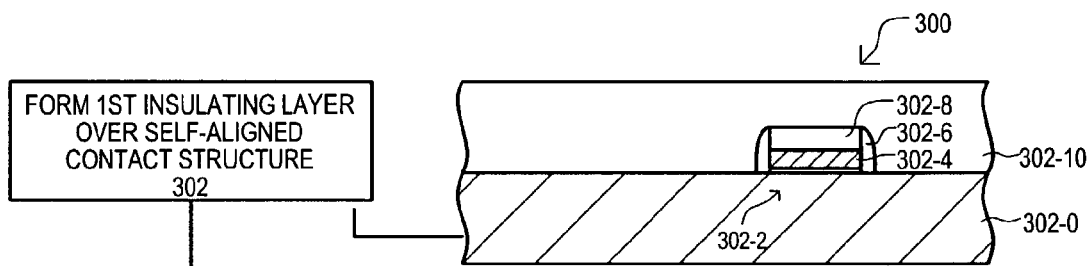
FIGS. 3A to 3G is a flow diagram and side cross sectional views of a semiconductor device according to a third embodiment.

A method according to a third embodiment will now be described with reference to FIGS. 3A to 3G. FIGS. 3A to 3G show a flow diagram of various steps according to a second embodiment, along with corresponding side cross sectional views. The method is designated by the general reference character 300 and may include forming a first insulating layer over a self-aligned contact structure (step 302). As shown in FIG. 3A, a substrate 302-0 may have a self-aligned contact structure 302-2 formed thereon. A self-aligned contact structure 302-2 may include a conductor 302-4, having insulating sidewalls 302-6 and an insulating top layer 302-8.

In one particular example, a self-aligned contact structure 302-2 may be a transistor gate structure. A conductor 302-4 may be a polysilicon gate with a layer of silicide formed thereon. Such a gate may be formed over a gate dielectric. Insulating sidewalls 302-6 may comprise silicon dioxide, silicon oxynitride and/or silicon nitride. An insulating top layer 302-8 may also comprise silicon dioxide, silicon oxynitride and/or silicon nitride.

FIG. 3A also shows a first insulating layer 302-10 formed over a self-aligned contact structure 302-2. A first insulating layer 302-10 may comprise doped silicon dioxide, more preferably PSG, even more preferably HDP deposited PSG having a phosphorous concentration greater than 7% by weight.

Figure 3B:
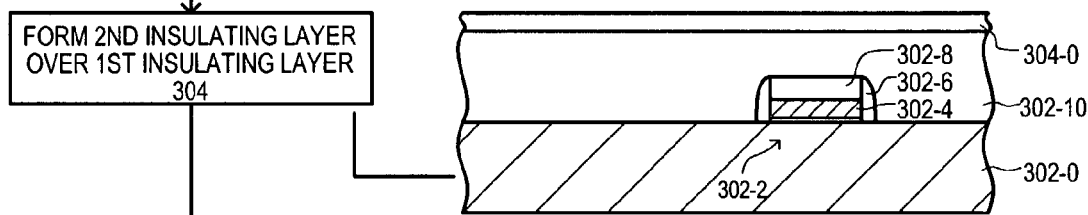

A method 300 may further include forming a second insulating layer over the first insulating layer (step 304). FIG. 3B shows a second insulating layer 304-0 formed over a first insulating layer 302-10. A second insulating layer 304-0 may comprise a different material than a first insulating layer 302-10. Preferably, a second insulating layer 304-0 may comprise USG, while a first insulating layer 302-10 may comprise doped silicate glass. Even more preferably, a second insulating layer 304-0 may comprise USG, while a first insulating layer 302-10 may comprise PSG having a phosphorous concentration of greater than 7% by weight.

Figure 3C:
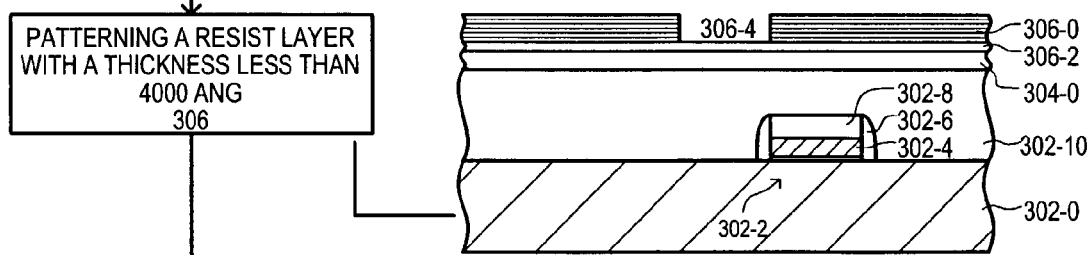

A method 300 may also include patterning a resist layer having a thickness of less than 4500 Å (step 306). FIG. 3C shows a photoresist layer 306-0 formed over a second insulating layer 304-0. As shown in the figure, a photoresist layer 306-0 may be formed in conjunction with an anti-reflective coating. In the example of FIG. 3C, a bottom anti-reflective coating (BARC) 306-2 is formed below a photoresist layer 306-0. Further, a photoresist layer 306-0 has been patterned to include an opening 306-4 over a location where a contact hole is to be formed.

A photoresist layer 306-0 may have a maximum thickness. For example, a photoresist layer may have a thickness of less than 4500 Å, preferably less than 4000 Å, even more preferably less than 3500 Å. In addition, a photoresist layer 306-0 according to the embodiment of FIGS. 3A to 3G may be conceptualized according to achievable pattern geometries. Thus, a photoresist layer 306-0 may have achievable minimum feature sizes of less than 0.3 µm, preferably less than 0.25 µm, even more preferably less than 0.20 µm.

According to a third embodiment, a method 300 may also include etching through a first insulating layer 302-0 and second insulating layer 304-0 to form a contact hole that is self-aligned with respect to a conductor 302-2. In the third embodiment illustrated, such etching may include three etch steps (steps 308, 310 and 312).

Figure 3D:
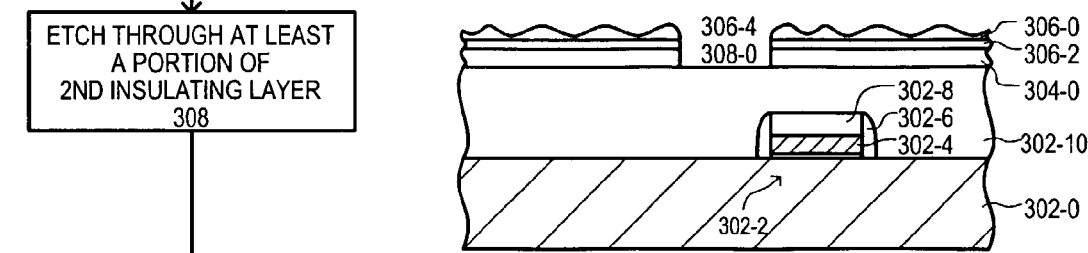

A step 308 may include etching through at least a portion of a second insulating layer 304-0. More preferably, etching through at least one half the thickness of a second insulating layer 304-0. A semiconductor device following a step 308 is shown in FIG. 3D. As shown in FIG. 3D, a step 308 can remove at least half the thickness of a second insulating layer 304-0 below an opening 306-4, resulting in an opening 308-0 in at least a portion of a second insulating layer 304-0. In addition, a step 308 may remove a portion, or all of a photoresist layer 306-0 and/or BARC layer 306-2. As will be noted below, an opening 308-0 can serve as a "hard" etch mask as any remaining photoresist layer 306-0 may be consumed by subsequent etching.

Etching according to a step 308 may include reactive ion etching, preferably employing a magnetically enhanced reactive ion etch tool, even more preferably, an etching with a machine such as a Super e Centura manufactured by Applied Materials, Inc. Such an etching may include etching with one or more fluorine-based reactant gases. Such gases may include $CF_4$, $CHF_3$, and $C_2H_2F_4$, preferably all three gases. In one approach, etching may be predominantly by $CF_4$, more preferably, a flow rate of $CF_4$ may be greater than a combined flow rate of all other reactant gases, even more preferably a flow rate of $CF_4$ may be about 50 standard cubic centimeters per second (sccm), a flow rate of $CHF_3$ may be about 10 sccm, and a flow rate of $C_2H_2F_4$ may be about 2 sccm.

In addition to reactant gases noted above, a step 308 may include introducing one or more inert gases into an etch chamber. For the particular flow rates noted above, argon may be introduced at a flow rate of about 90 sccm, while nitrogen may be introduced at a flow rate of about 5 sccm.

In addition to the above reactant gas parameters, etching according to a step 308 may include etching at a pressure of less than 200 milliTorr (mT), preferably about 100 mT. In the case of magnetically enhanced RIE, a magnetic field may be greater than 10 gauss (G), preferably greater than 15 G, even more preferably about 20 G. Such a magnetic field may also have sine-type modulation. Still further, a radio frequency (RF) power for etching may be in the general range of 300–800 watts (W), preferably in a range of about 400–600 W, even more preferably about 500 W.

At the more preferable variables noted above, etching according to a step 308 may have a duration in the general range of 80–200 seconds, preferably about 100–150 seconds, even more preferably about 115 seconds.

As noted above, a third embodiment may include three etching steps in forming a contact hole. A step 308 may etch through at least a portion of a second insulating layer. A step 310 may include a "blending" step that may remove any remaining portions of a second insulating layer 304-0 below an opening 308-0 and expose a first insulating layer 302-10. Further, a step 310 may remove at least a portion of a first insulating layer 302-10 below an opening 308-0. Such etching may form a "hard" mask out of a second insulating layer 304-0.

Figure 3E:
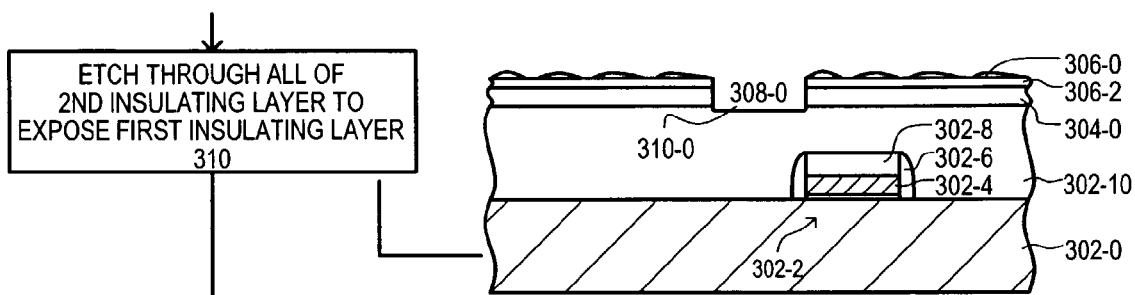

A semiconductor device following a step 310 is shown in FIG. 3E. As shown in FIG. 3E, a step 310 can remove all of a second insulating layer 304-0, and a portion, preferably a small portion, of a first insulating layer 302-10 below an opening 306-4. This may result in an opening 310-0 that extends through a second insulating layer 304-0 and into a first insulating layer 302-0.

A step 308 may result in essentially all of a photoresist layer 306-0 and/or BARC layer 306-2 being removed. Conventionally, such an occurrence may prevent any further transfer of a photoresist layer 306-0 pattern to underlying layers. However, a patterning of a second insulating layer 304-0, in conjunction with an appropriate change in etch recipe as taught by the present invention, can enable a second insulating layer 304-0 to function as a hard etch mask. Consequently, a pattern originating in a consumed photoresist layer 306-0 can continue to be transferred to lower layers.

As in the case of a step 308, etching according to a step 310 may include reactive ion etching, preferably employing a magnetically enhanced reactive ion etch tool, even more preferably, etching with a machine such as a Super e Centura manufactured by Applied Materials, Inc. Such an etching may include the various variables and/or ranges for reactant gases, inert gases, magnetic field strength and modulation, and RF power as described for step 308. A step 308 may include etching at a lower pressure, however. In particular, a pressure may be less than 100 mT, preferably less than 70 mT, even more preferably about 55 mT.

At the more preferable variables indicated above, etching according to a step 310 may have a duration in the general range of 2–15 seconds, preferably about 3–10 seconds, even more preferably about 4 seconds.

According to a third embodiment a step 312 may include etching through a first insulating layer. A step 312 may expose a substrate, or in a process that includes a protective etching liner, or the like, expose such a liner. According to a third embodiment, a method 300 may preferably not include such a liner layer.

Figure 3F:
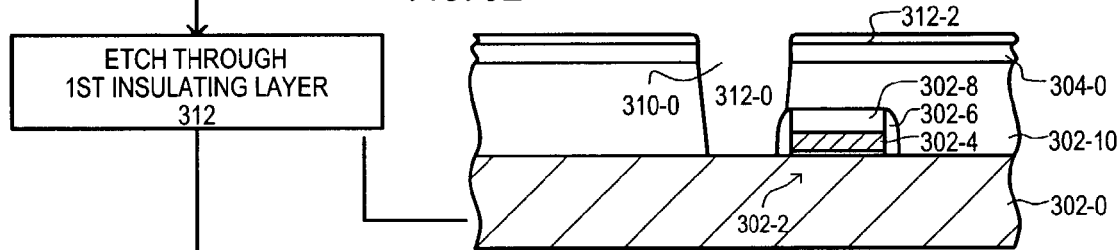

A semiconductor device following a step 312 is shown in FIG. 3F. As shown in FIG. 3F, a step 312 can remove essentially all of a first insulating layer 302-0 below an opening 310-4, to form a contact hole 312-0 that can be self-aligned with respect to a conductive structure 302-2. A substrate 302-0 may be exposed, which can enable a contact to be formed thereto.

A step 308 may result in a photoresist layer 306-0 and/or BARC layer 306-2 being completely consumed and redistributed, at least in part, onto a top surface of a second insulating layer 304-0. Redistributed material is shown as item 312-2. While a portion of a second insulating layer 304-0 may be removed as well, a second insulating layer 304-0 preferably retains a hard etch mask structure.

Like steps 308 and 310, etching according to a step 312 may include reactive ion etching, preferably employing a magnetically enhanced reactive ion etch tool, even more preferably, etching with a machine such as a Super e Centura manufactured by Applied Materials, Inc.

A step 312 may include a different etch chemistry than a step 310 and/or 308. While etching may include etching with one or more fluorine-based reactant gases, such a step may preferably include $CHF_3$ and $C_2H_2F_4$, while $CF_4$ is not included in any significant amounts. In one approach, etching may be predominantly by $CHF_3$, more preferably, a flow rate of $CHF_3$ and/or $C_2H_2F_4$ may be greater than a combined flow rate of any other reactant gases, even more preferably $CHF_3$ and $C_2H_2F_4$ may be the only reactant gases with $CHF_3$ having a flow rate of about 80 sccm and $C_2H_2F_4$ having a flow rate of about 8 sccm.

In addition to reactant gases noted above, a step 308 may include introducing one or more inert gases. For the particular flow rates noted above, argon may be introduced at a flow rate of about 90 sccm, while nitrogen may not be introduced into a reaction chamber.

In addition to the above reactant gas parameters, etching according to a step 308 may include etching at a pressure of less than 100 milliTorr (mT), preferably less than 80 mT, even more preferably about 55 mT. In the case of magnetically enhanced RIE, a magnetic field may be greater than 15 gauss (G), preferably greater than 20 G, even more preferably about 25 G. Such a magnetic field may also have sine-type modulation. Still further, a radio frequency (RF) power for etching may be in the general range of 300–800 watts (W), preferably in a range of about 400–600 W, even more preferably about 500 W.

At the more preferable variables noted above, etching according to a step 312 may have a duration in the general range of 100–220 seconds, preferably about 150–200 seconds, even more preferably about 180 seconds.

In this way, a method 300 according to a third embodiment may form a self-aligned contact hole with a combination of a photoresist mask and a hard etch mask. This is in contrast to conventional approaches, which may use one or the other. Such an approach may enable the use of small geometry photoresists, that would otherwise be consumed and therefore, not function in conventional etching methods.

As indicated in FIG. 3F, consumption of a photoresist layer 306-0 and/or a BARC layer 306-2 may result in re-distribution of such material (typically a polymer) on a surface of a second insulating layer 304-0. Consequently, a method 300 may also include removing re-distributed resist residue (step 314).

Figure 3G:
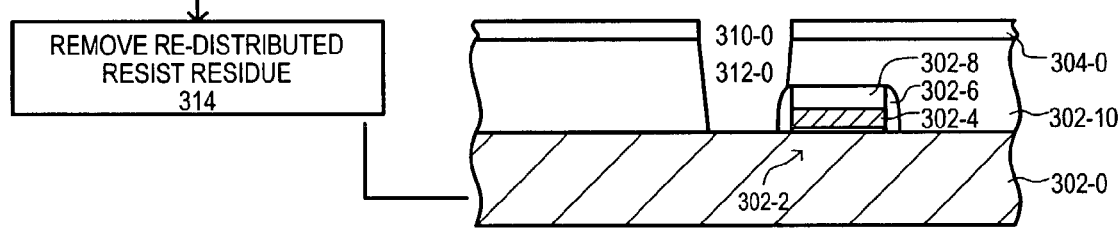
Figure 6A:
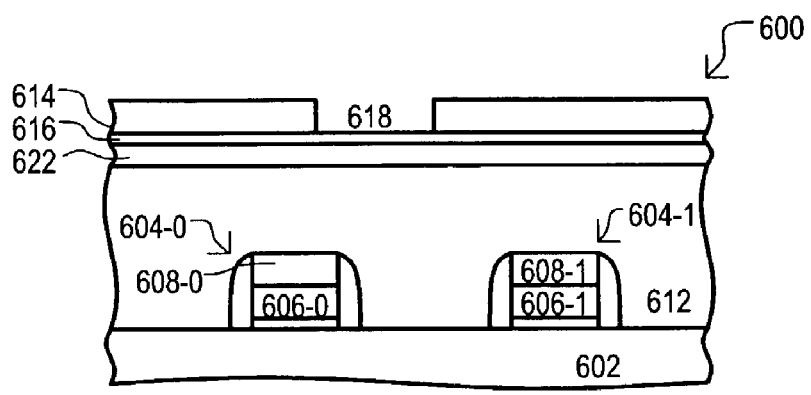
FIGS. 6A to 6C show a third example of a conventional method of forming contacts in a semiconductor device.
Figure 6B:
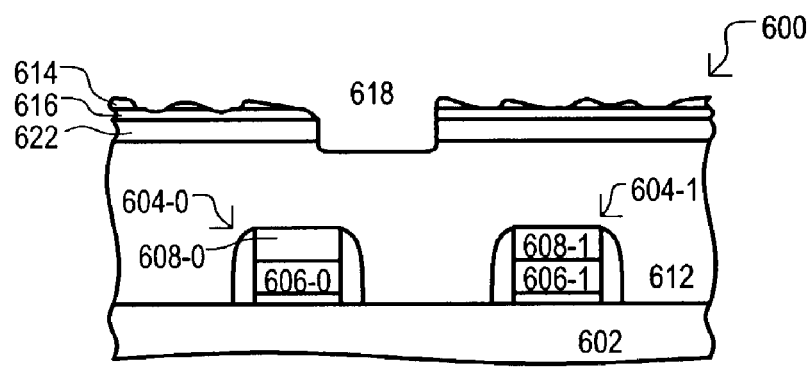
Figure 6C:
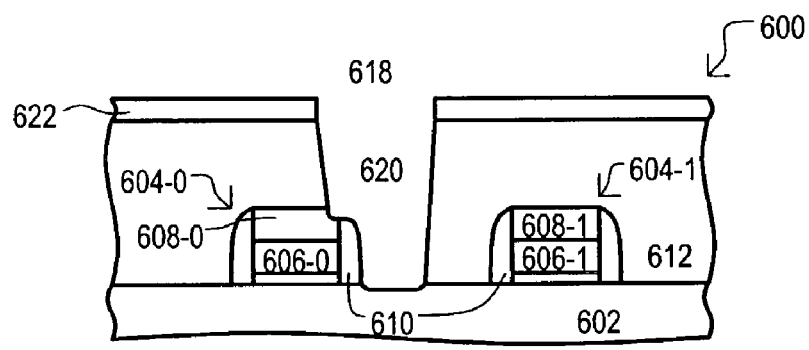

A step 314 may include plasma etching with oxygen ($O_2$) as a reactant gas. Such etching is also referred to as "ashing." A semiconductor device following a step 314 is shown in FIG. 3G. Redistributed material, shown as 312-2 in FIG. 3F, can be removed.

A number of embodiments have been described setting forth approaches to forming a contact hole and/or a self-aligned contact hole with a combination of a photoresist mask and hard etch mask. Such an approach can enable the use of relatively thin resists (e.g., less than 4000 Å) that might be consumed in conventional etching methods.

It is understood that while the various embodiments disclosed may preferably form contact holes to a substrate, the present invention should not necessarily be limited to such an application. Such contact holes may be formed as "vias" or the like, forming openings to a conductive layer other than a substrate.

It is understood that while the various particular embodiments have been set forth herein, methods and structures according to the present invention could be subject to various changes, substitutions, and alterations without departing from the spirit and scope of the invention. Accordingly, the present invention is intended to be limited only as defined by the appended claims.

What is claimed is:

1. A method, comprising:
    etching through a non-resist mask layer to form a hard etch mask comprising undoped silicon dioxide and having at least one opening below a photoresist layer opening, the photoresist layer having a thickness of less than about 4000 angstroms; and
    etching through a first insulating layer, formed below the non-resist mask layer, with the photoresist layer and hard etch mask as an etch mask, without first removing the photoresist layer.

2. The method of claim 1, wherein:
    the photoresist layer has an initial thickness of less than about 3500 angstroms.

3. The method of claim 1, wherein:
    the photoresist layer has a minimum achievable feature size of less than 0.2 micron.

4. The method of claim 1, wherein:
    the first insulating layer comprises silicon dioxide having a higher dopant concentration than the hard etch mask.

5. A self-aligned contact etch method, comprising the steps of:
    etching through at least a portion of a second insulating layer with predominantly carbon tetrafluoride ($CF_4$) as a reactant gas to form a hard etch mask; and
    etching a contact hole through a first insulating layer substantially without $CF_4$ as a reactant gas, with an etch mask comprising a photoresist layer having an initial thickness less than 4,000 angstroms formed over the hard etch mask.

6. The self-aligned contact etch method of 5, wherein:
    the photoresist layer has an initial thickness of less than 3500 angstroms.

7. The self-aligned contact etch method of 5, further including:

etching through at least a portion of the second insulating layer to form the hard etch mask with first etch parameters; and etching through at least a portion of the first insulating layer with second etch parameters that are different than the first etch parameters.

8. The self-aligned contact etch method of claim 7, wherein:

the first etch parameters include reactive ion etching with tetafluoroethane ($C_2H_2F_4$) as a reactant gas flowing at a first rate; and the second etch parameters include reactive ion etching with ($C_2H_2F_4$) as a reactant gas flowing a second flow rate greater than the first flow rate.

9. The self-aligned contact etch method of claim 5, wherein:

the first and second insulating layers comprise silicon dioxide, the first insulating layer having a higher dopant concentration than the second insulating layer.

* * * * *